(12) United States Patent
Yang et al.

(10) Patent No.: US 7,924,604 B2
(45) Date of Patent: Apr. 12, 2011

(54) STACKED MEMORY CELL FOR USE IN HIGH-DENSITY CMOS SRAM

(75) Inventors: Hyang-Ja Yang, Suwon-si (KR); Uk-Rae Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 936 days.

(21) Appl. No.: 11/588,223

(22) Filed: Oct. 27, 2006

(65) Prior Publication Data
US 2007/0147107 A1 Jun. 28, 2007

(30) Foreign Application Priority Data
Dec. 26, 2005 (KR) .................. 10-2005-0129470

(51) Int. Cl.
*G11C 11/00* (2006.01)
(52) U.S. Cl. .................... 365/154; 365/174; 365/168
(58) Field of Classification Search .................. 365/154, 365/174, 168
See application file for complete search history.

(56) References Cited

U.S. PATENT DOCUMENTS

| | | | |
|---|---|---|---|
| 5,453,950 A | 9/1995 | Voss et al. | |
| 5,867,443 A | 2/1999 | Linderman | |
| 6,271,542 B1 * | 8/2001 | Emma et al. | 257/67 |
| 6,940,746 B2 * | 9/2005 | Kushida | 365/154 |
| 7,098,478 B2 * | 8/2006 | Takaura et al. | 257/67 |
| 2002/0020886 A1 * | 2/2002 | Rockett | 257/369 |
| 2006/0028861 A1 * | 2/2006 | Han et al. | 365/154 |

FOREIGN PATENT DOCUMENTS

| | | |
|---|---|---|
| JP | 09-293380 | 11/1997 |
| JP | 10-188570 | 7/1998 |
| JP | 2004-259352 | 9/2004 |

* cited by examiner

*Primary Examiner* — Vu A Le
*Assistant Examiner* — Han Yang
(74) *Attorney, Agent, or Firm* — Volentine & Whitt, PLLC

(57) ABSTRACT

A stacked memory cell for use in a high-density static random access memory is provided that includes first and second pull-down transistors formed in a first layer, a pass transistor connected between a gate of the second pull-down transistor and a bit line and formed in the first layer and a first and second pull-up transistors formed in a second layer located above the first layer and connected with the first and second pull-down transistors respectively to form an inverter latch. With the construction of a stacked memory cell having a lone pass transistor, cell size is reduced compared to a conventional six-transistor cell, and driving performance of the pass transistor can be improved.

5 Claims, 14 Drawing Sheets

STACKED MEMORY CELL FOR USE IN HIGH-DENSITY CMOS SRAM

BACKGROUND

1. Technical Field

The present invention relates to a semiconductor integrated circuit, and more particularly, to a stacked memory cell for use in a high-density complementary metal oxide semiconductor (CMOS) static random access memory (SRAM).

This application claims the benefit of Korean Patent Application No. 2005-0129470, filed Dec. 26, 2005, the disclosure of which is hereby incorporated herein by reference in its entirety.

2. Discussion of Related Art

In general, in order to meet the ever-increasing requirements for high performance electronic systems, semiconductor memory devices, such as SRAMs, need to constantly increase in speed and density. Hence, the makers of the semiconductor memory devices have exerted large efforts to incorporate ever-smaller memory cells in various integrated circuits.

FIG. 1 is an equivalent circuit diagram of a known six-transistor (6T) CMOS SRAM cell. As shown in FIG. 1, the 6T CMOS SRAM includes a pair of pull-up transistors 11 (PU1 and PU2), a pair of pull-down transistors 21 (PD1 and PD2) and first and second pass transistor AT1 and AT2. The first and second pass transistors AT1 and AT2, sometimes referred to as "access transistors", have gates commonly connected to a word line (WL) node, and drains respectively connected to a bit line (BL) node and a bit line bar (BLB) node, respectively. Here, the BL and BLB nodes have complementary relationship.

A planar arrangement structure of the 6T CMOS SRAM cell of FIG. 1 is depicted in FIG. 2, which illustrates a typical layout of a CMOS SRAM cell. As can be deduced from FIG. 2, all of the transistors of the 6T CMOS SRAM of FIG. 1 are disposed in a common layer.

When the 6T CMOS SRAM cell as illustrated in FIG. 1 is constructed in a single common layer, the area occupied per cell is relatively increased, which serves to restrict high-density integration. Accordingly, in order increase device density, a technique of fabricating memory cells in a stacked-type arrangement has been developed. A particular example of a fabrication technique of stacking the memory cell transistors is disclosed in Korean Patent Application Nos. 2004-0002080 and 2004-0002088 filed by the same Applicant as the present disclosure.

By way of a first example for fabricating a single stacked-type memory cell, four N-type MOS transistors (pull-down and pass transistors) of the six MOS transistors constituting a static memory cell can be formed in a first semiconductor substrate layer while two P-type MOS transistors (pull-up transistors) can be formed in a second substrate layer, such as a channel silicon layer formed on gate electrodes of the N-type MOS transistors in an insulated fashion.

Continuing, FIG. 3 shows the CMOS SRAM cell of FIG. 1 located on the left side with an equivalent circuit diagram located to the right arrow line AW1 illustrating the case where the CMOS SRAM cell of FIG. 1 is formed as a three-layer stacked structure. The stacked cell illustrated on the right side of FIG. 3 has a structure in which first and second pull-down transistors PD1 and PD2 are disposed in a first layer, first and second pull-up transistors PU1 and PU2 are disposed in a second layer and first and second pass transistors AT1 and AT2 are disposed in a third layer. FIG. 4 illustrates the schematic cross-sectional structure of a stacked-type 6T CMOS SRAM cell of FIG. 3. FIGS. 5 and 6 illustrate the layout of a stacked-type 6T CMOS SRAM cell of FIG. 3.

Returning to FIG. 4, a semiconductor substrate 100 is shown having a number of P-wells 102 with a drain 104 and source 105 shown as embedded in a left-hand P-well. A gate insulating layer 108 is disposed over the left-hand P-well 102 separating a pull-down transistor gate (PDG) from P-well 102. Sidewall spacers 109 and 110 abut both sides of the PDG. Note that the PDG, a pull-up transistor gate (PUG), and pass transistor gate (ATG) are stacked in layers L1, L2, and L3 respectively. Conductive interconnect S2 serves to connect silicon layers CS1 and CS2, which are silicon layers formed by selective epitaxial growth interconnected, and conductive interconnect S1 serves to connect source 105 and layer CS1.

Continuing to the planar arrangement diagrams of FIGS. 5 and 6, it should be appreciated that it can be difficult to form a pattern for the ATG, which resides at the top of the stacked array of transistors.

Further, the stacked-type cell structure of FIG. 4 has a problem in that its bridge margin is weak with respect to a given cell node. Further, because driving performance of the pass transistor is lowered in proportion to the increase of the integration density of a semiconductor device, chip performance may suffer.

Thus, even in the case of semiconductor memories having stacked-type memory cells, a more preferable memory cell arrangement may be desirable.

SUMMARY

The present invention solves the above-mentioned problems in that it provides a stacked memory cell for use in high-density static random access memory having more efficient memory cells within a restricted size.

In accordance with an exemplary embodiment, a stacked memory cell for use in a high-density static random access memory includes a first pull-down transistor and a second pull-down transistor both formed in a first layer, a first pull-up transistor and a second pull-up transistor both formed in a second layer located over the first layer, wherein the first and second pull-up transistors are respectively connected to the first and second pull-down transistors to form an inverter latch; and a pass transistor connected between a gate of the second pull-down transistor and a bit line, and formed in either a third layer located over the first layer or the second layer.

In accordance with another exemplary embodiment, a stacked memory cell for use in a high-density static random access memory includes a first pull-down transistor and a second pull-down transistor both formed in a first layer, a first pull-up transistor and a second pull-up transistor both formed in a second layer located over the first layer, wherein the first and second pull-up transistors are respectively connected to the first and second pull-down transistors to form an inverter latch and a pass transistor connected between a gate of the first pull-down transistor and a bit line, and formed in the first layer.

In accordance with yet another exemplary embodiment, a stacked memory cell for use in a high-density static random access memory includes a first pull-down transistor and a second pull-down transistor both formed in a first layer, a first pull-up transistor and a second pull-up transistor both formed in a second layer located over the first layer, wherein the first and second pull-up transistors are respectively connected to the first and second pull-down transistors to form an inverter latch and a pass transistor formed in a third layer located over the second layer and connected between a first data node of the inverter latch and a bit line.

In accordance with yet another exemplary embodiment, a five-transistor (5T) complementary metal oxide semiconductor (CMOS) static random access memory (SRAM) cell in which a state of 1 or 0 is written through a single bit line includes a first inverter having a first pull-up transistor and a first pull-down transistor connected in series between supply voltage and ground to form a first data node between the first pull-up and pull-down transistors, a second inverter having a second pull-up transistor and a second pull-down transistor connected in series between the supply voltage and ground to form a second data node between the second pull-up and pull-down transistors and a pass transistor connected between a gate of the first inverter and the single bit line, and receiving a word line signal through a gate, wherein the first pull-down transistor, the second pull-down transistor and the pass transistor are formed in a first conductive layer, and wherein the first pull-up transistor and second pull-up transistor are formed in a second conductive layer located over the first conductive layer.

In accordance with still another exemplary embodiment, a stacked memory cell array for use in high-density static random access memory includes a first memory cell that includes a first pull-down transistor, a second pull-down transistor and a first pass transistor all three of which are formed in a first layer, and a first pull-up transistor and a second pull-up transistor both of which are formed in a second layer located over the first layer, a second memory cell that includes a third pull-down transistor, a fourth pull-down transistor and a second pass transistor all three of which are formed in the first layer, and a third pull-up transistor and a fourth pull-up transistor both of which are formed in the second layer, a bit line commonly connected to a drain of the first pass transistor and a drain of the second pass transistors and a first word line and a second word line that are independently connected to gates of the first and second pass transistors.

In accordance with still yet another exemplary embodiment, a method for fabricating a stacked-type single port static random access memory (SRAM) cell includes forming an SRAM cell having one or more pull-down transistors, one or more pull-up transistors and a single access transistor in a single or double stacked cell structure and forming a single bit line without forming a bit line having complementary relationship.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

Figure 1:
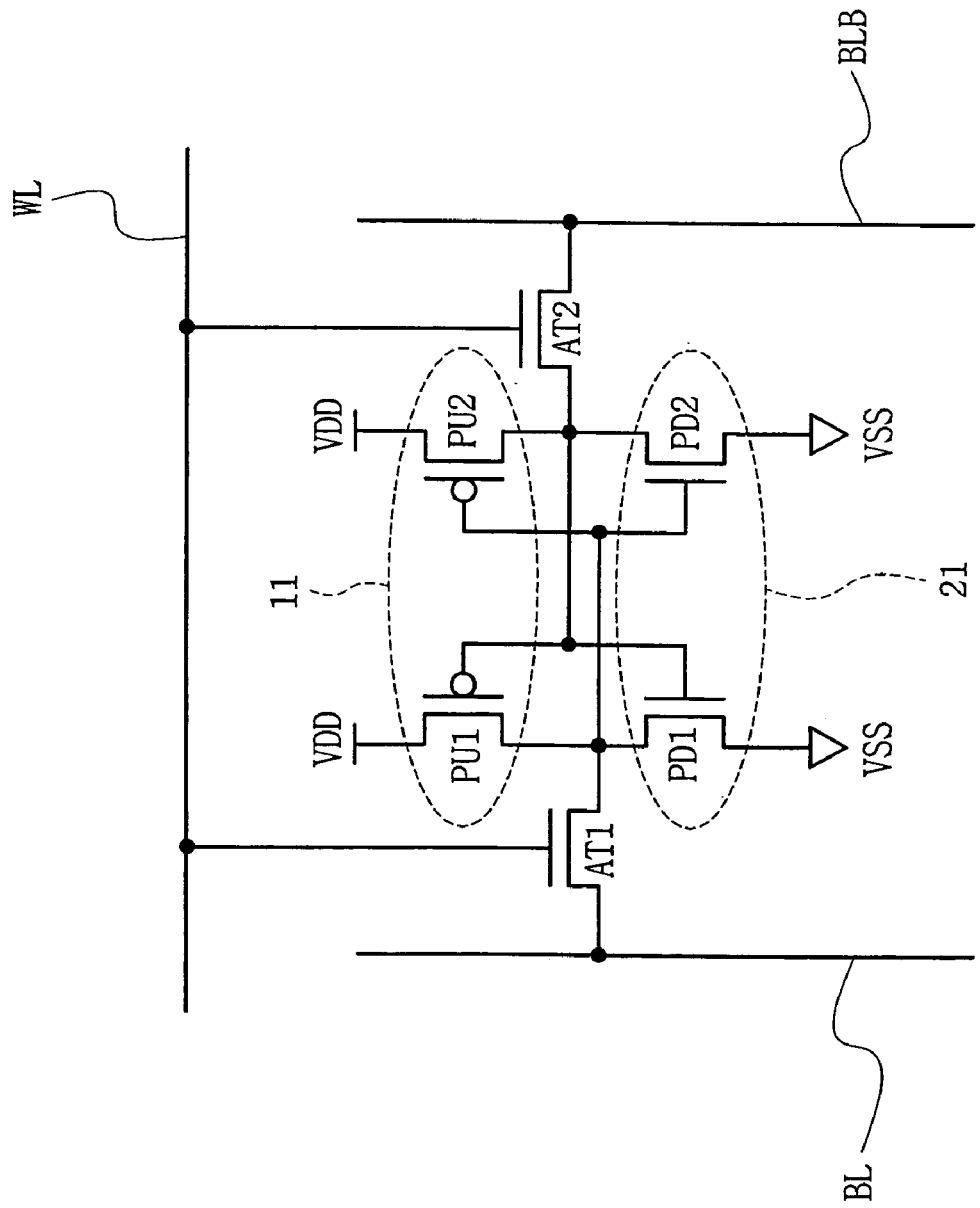
FIG. 1 is an equivalent circuit diagram of a known six-transistor (6T) CMOS SRAM cell.
Figure 2:
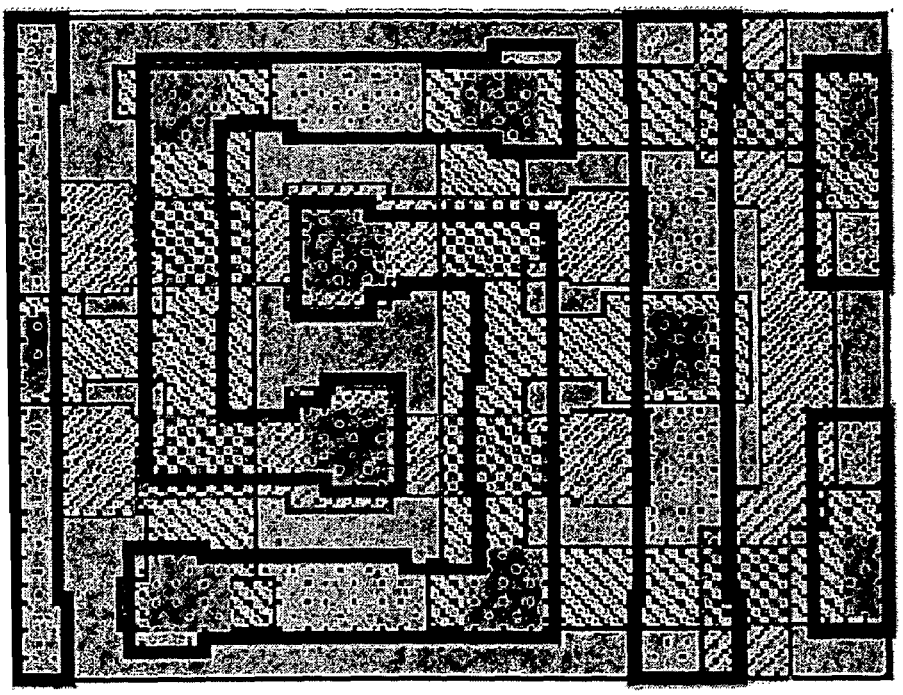
FIG. 2 is a layout diagram of a CMOS SRAM cell of FIG. 1.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numbers refer to like elements throughout the specification.

Figure 7:
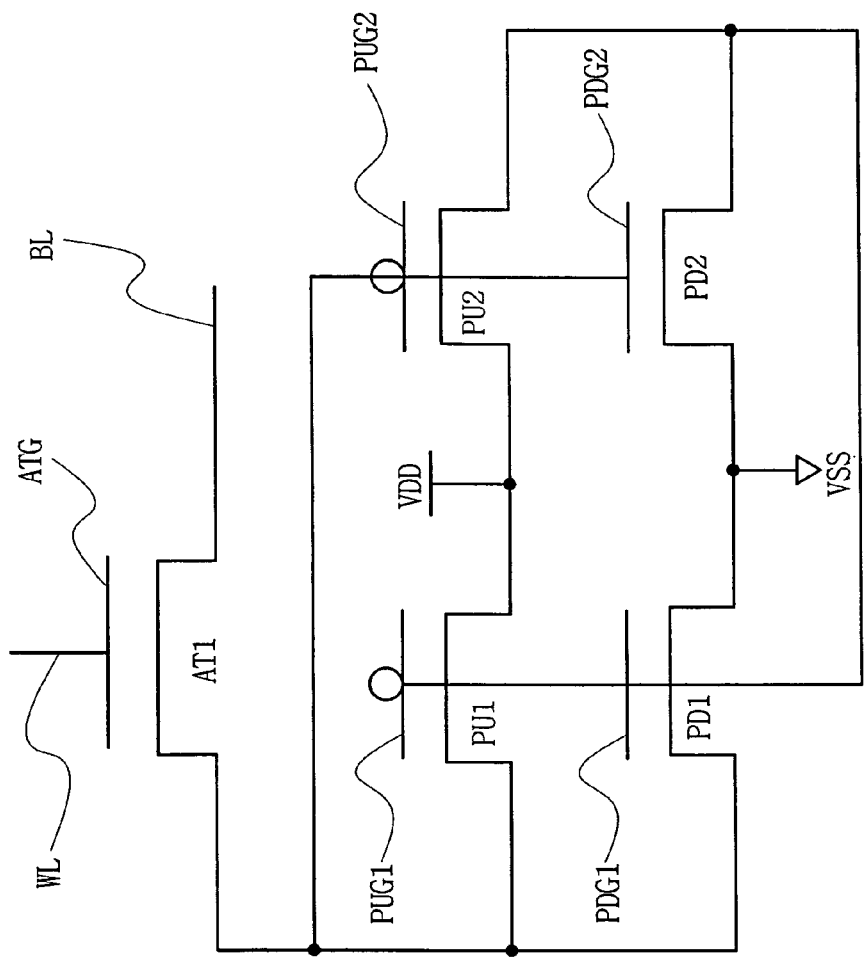
FIG. 7 is an equivalent circuit diagram of a stacked-type 5T CMOS SRAM cell according to an exemplary embodiment of the present invention.

FIG. 7 is an equivalent circuit diagram of a stacked-type five-transistor (5T) CMOS SRAM cell according to an exemplary embodiment of the present invention. As is shown in FIG. 7, a single pass transistor AT1 is disposed in a top layer, a first and second pull-up transistors PU1 and PU2 are disposed in a middle layer and a first and second pull-down transistor PD1 and PD2 are disposed in a bottom layer. Note that the pass transistor AT1 is connected between a gate of the second pull-up transistor PU2 and a bit line. Also note that the first and second pull-up transistors PU1 and PU2 are formed over the bottom first layer and connected with the first and second pull-down transistors PD1 and PD2 respectively, thereby forming an inverter latch.

For embodiments of stacked SRAM cells having three layers, the pull-down transistors PD1 and PD2 can be disposed on the lowermost layer in the form of a metal oxide semiconductor (MOS) transistors having very stable, excellent characteristics.

However, the pull-up (or load) transistors PU1 and PU2 and pass transistor AT1, which are disposed the upper layers, are formed from non-bulk channel silicon and thus may have relatively unstable operation characteristics and low driving performance. An SRAM cell has operation stability determined by a ratio of the performance of the pass transistors to the pull-down transistors. Due to low driving performance and degradation of the pass transistor, it may not be easy to overcome the unstable cell characteristic. For example, should a pass transistor be increased in size in order to increase its drive performance, it can be difficult to realize high-density integration. In contrast, when a pass transistor is decreased in size, the drive performance is lowered.

Accordingly, for the embodiment illustrated in FIG. 7, a stacked single port SRAM cell having a single pass transistor AT1 and a single bit line BL can allow for an increase in the size of the pass transistor, thus improving its drive performance. Further, due to having a stacked structure and a five-transistor cell, the stacked single port SRAM cell of FIG. 7 can give rise to the allowance of design rules incorporating greater margins, which will in turn improve yield.

Figure 3:
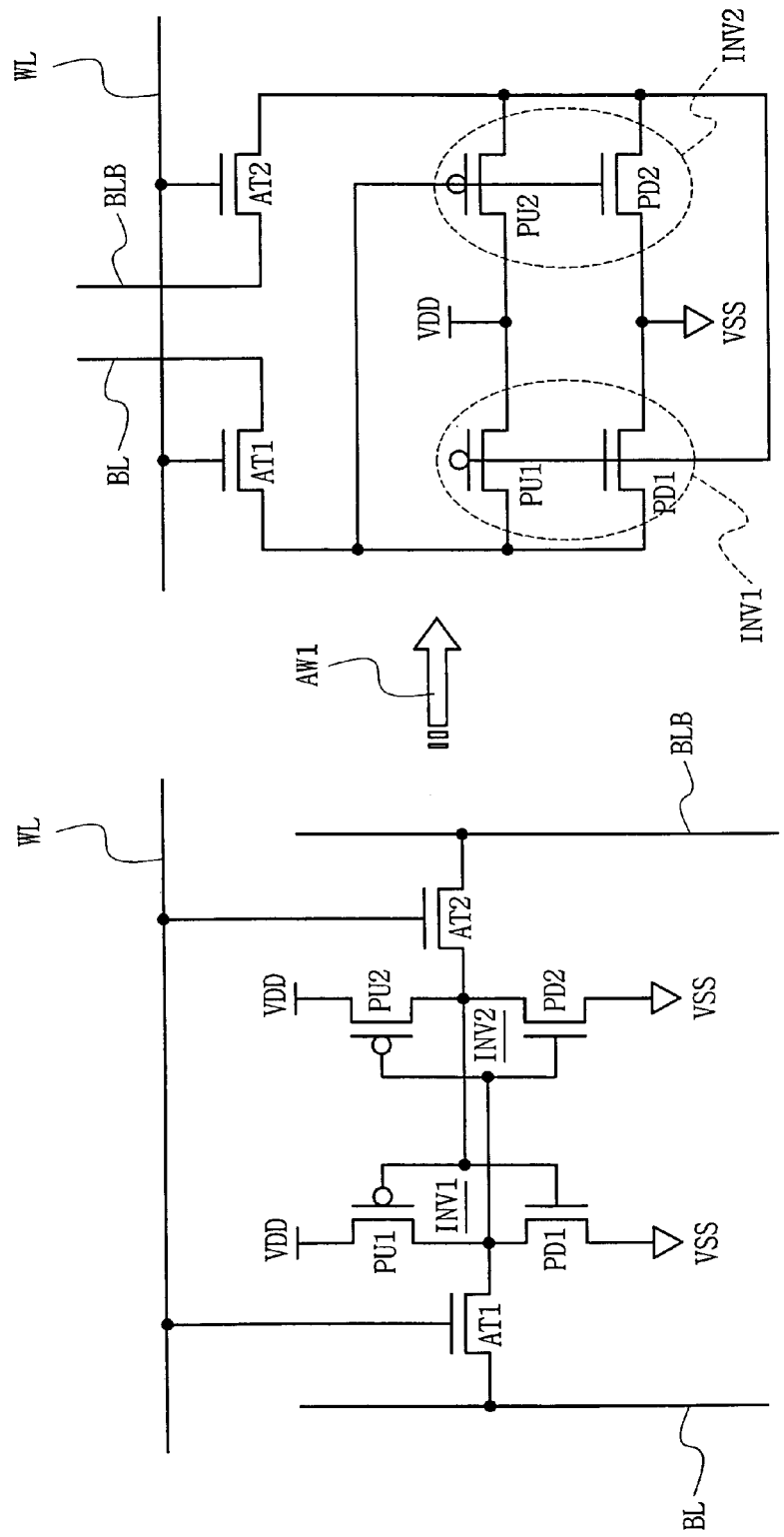
FIG. 3 is an equivalent circuit diagram of a stacked-type 6T CMOS SRAM cell illustrating the case where a CMOS SRAM cell of FIG. 1 is formed in a stacked-type configuration.
Figure 4:
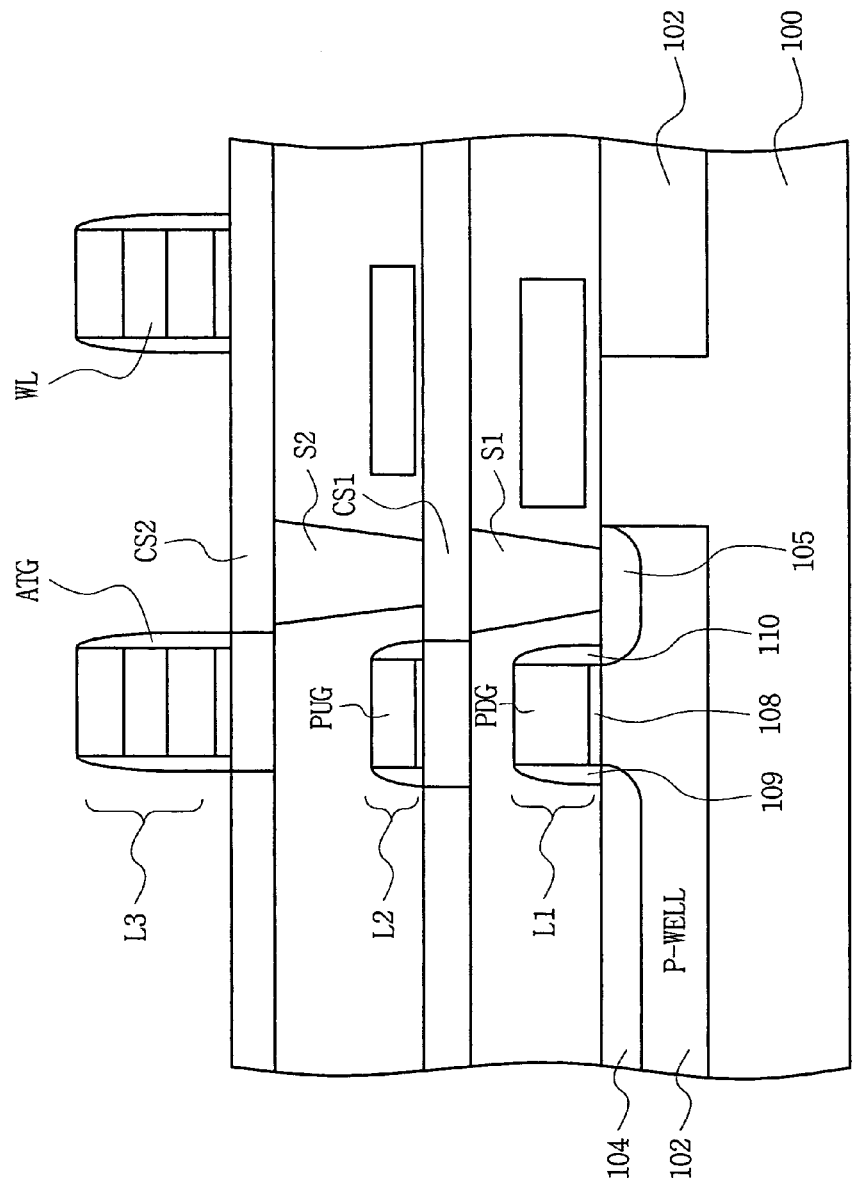
FIG. 4 is schematic cross-sectional view of a stacked-type 6T CMOS SRAM cell of FIG. 3.
Figure 5:
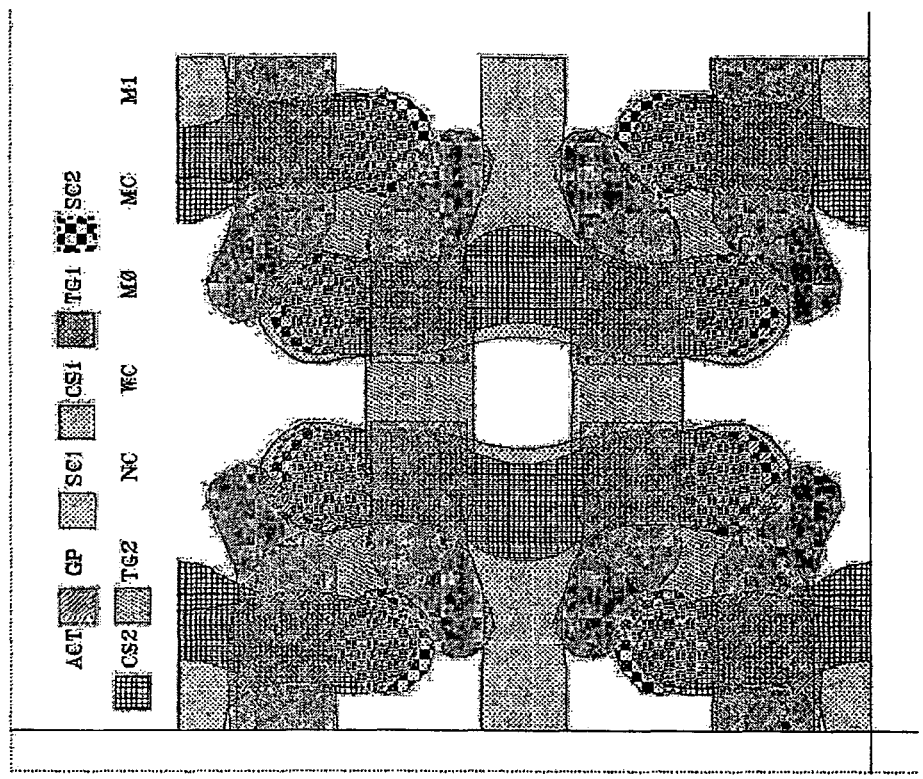
FIGS. 5 and 6 are schematic cross-sectional views of a stacked-type 6T CMOS SRAM cell of FIG. 3.

Unlike the six-transistor memory cell of FIG. 3, a single ended sense amplifier is used with the five-transistor memory cell of FIG. 7 in order to read "1" state of a data node. Prior to reading data, the bit line BL can be initiated into a preset reference level of voltage (e.g. voltage of ½ VDD). The data access transistor AT1 can be turned on by an appropriate voltage, e.g., a word line boosting voltage, applied to the gate.

Unlike the six-transistor memory cell, the five-transistor memory cell does not have a symmetry between the data nodes when binary values, 1 and 0, are written thereon. Accordingly, when writing 0 to a memory cell, the word line is activated in a high state, and a low level is applied to the single bit line.

Note that a memory cell array having the memory cells designed according to the embodiment of FIG. 7 can be constructed to share a bit line between neighboring memory cells, thus providing a possibility of realizing higher integration and increased performance.

Figure 8:
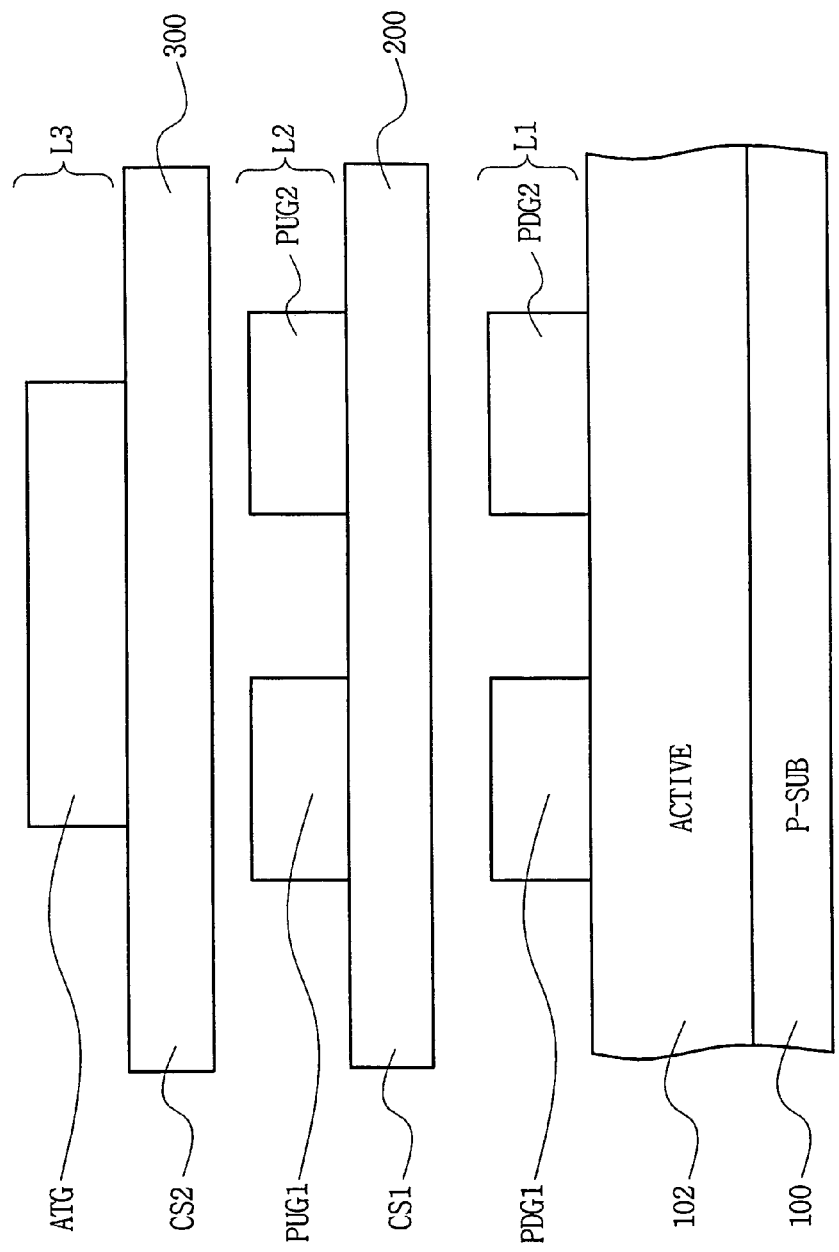
FIG. 8 is schematic cross-sectional view of a stacked-type 5T CMOS SRAM cell of FIG. 7.

FIG. 8 is a cross-sectional view of the stacked-type 5T CMOS SRAM cell of FIG. 7. Referring to FIG. 8, the first and second pull-down transistors PD1 and PD2 are formed on the bottom with their respective gates PDG1 and PDG2 formed in a first layer L1. Similarly, the first and second pull-up transistors PU1 and PU2 are formed above the pull-down transistors PD1 and PD2 with their respective gates PUG1 and PUG2 formed in a second layer L2 located over the first layer L1. The first and second pull-up transistors PU1 and PU2 are respectively connected with the first and second pull-down transistors PD1 and PD2 to form an inverter latch. A pass transistor AT1 is formed above the first and second pull-up transistors PU1 and PU with its gate ATG formed in a third layer L3 located over the second layer L2. The pass transistor AT1 is connected between a first data node of the inverter latch and a bit line BL.

As further shown in FIG. 8, a first active conductive layer 102 is disposed adjacent the first layer L1, a first channel silicon layer 200 is disposed adjacent to the second layer L2, and a second channel silicon layer 300 is disposed adjacent to the third layer L3.

The PUG1, PUG2 and ATG, i.e., the gates of the uppermost two layers, L2 and L3, can be formed into conductively doped polysilicon layers, surface layers of which can be formed into silicide layers of an ordinary silicide, such as a titanium silicide, a tungsten silicide and so on.

An insulating layer formed over each top gate can be formed of tetraethoxysilane (TEOS), silicon dioxide, silicon nitride, or a compound selected from the materials.

The first channel silicon layer 200 can be formed through a selective epitaxial growth (SEG) layer formed in a part of the active layer 102, and the second channel silicon layer 300 can formed through a SEG layer formed in a part of the channel silicon layer 200.

Figure 9:
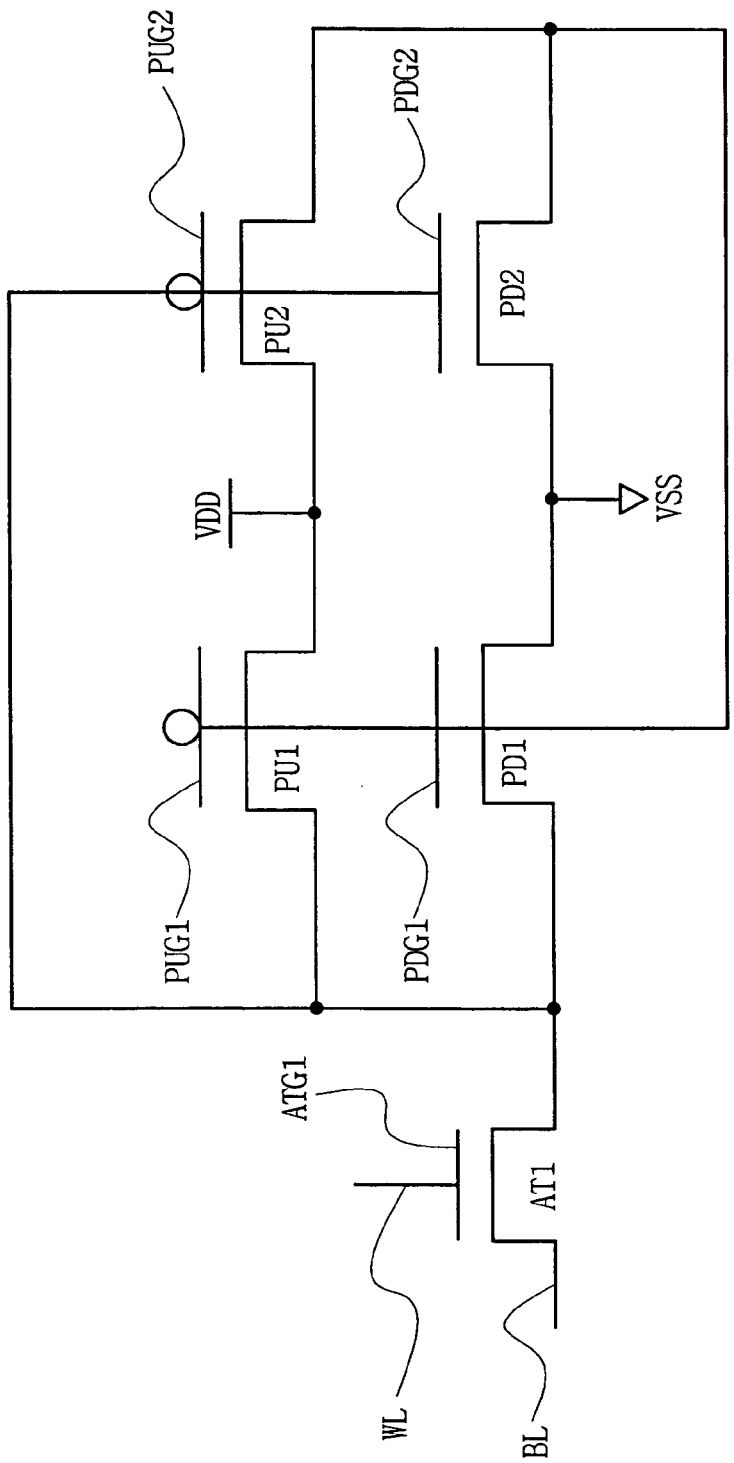
FIG. 9 is an equivalent circuit diagram of a stacked-type 5T CMOS SRAM cell according to another exemplary embodiment of the present invention.

FIG. 9 is an equivalent circuit diagram of a stacked-type 5T CMOS SRAM cell according to another exemplary embodiment of the present invention. FIG. 9 illustrates a single stacked memory cell having a two-layer stacked structure. As shown in FIG. 9, the first pull-down transistor PD1, second pull-down transistor PD2 and the pass transistor AT1 are formed in a first (lower) layer. The pass transistor AT1 is connected between a gate of the second pull-down transistor PD2 and a bit line BL. The first and second pull-up transistors PU1 and PU2 are formed in a second layer located over the first layer, and are respectively connected to the first and second pull-down transistors PD1 and PD2 to form an inverter latch.

Figure 10:
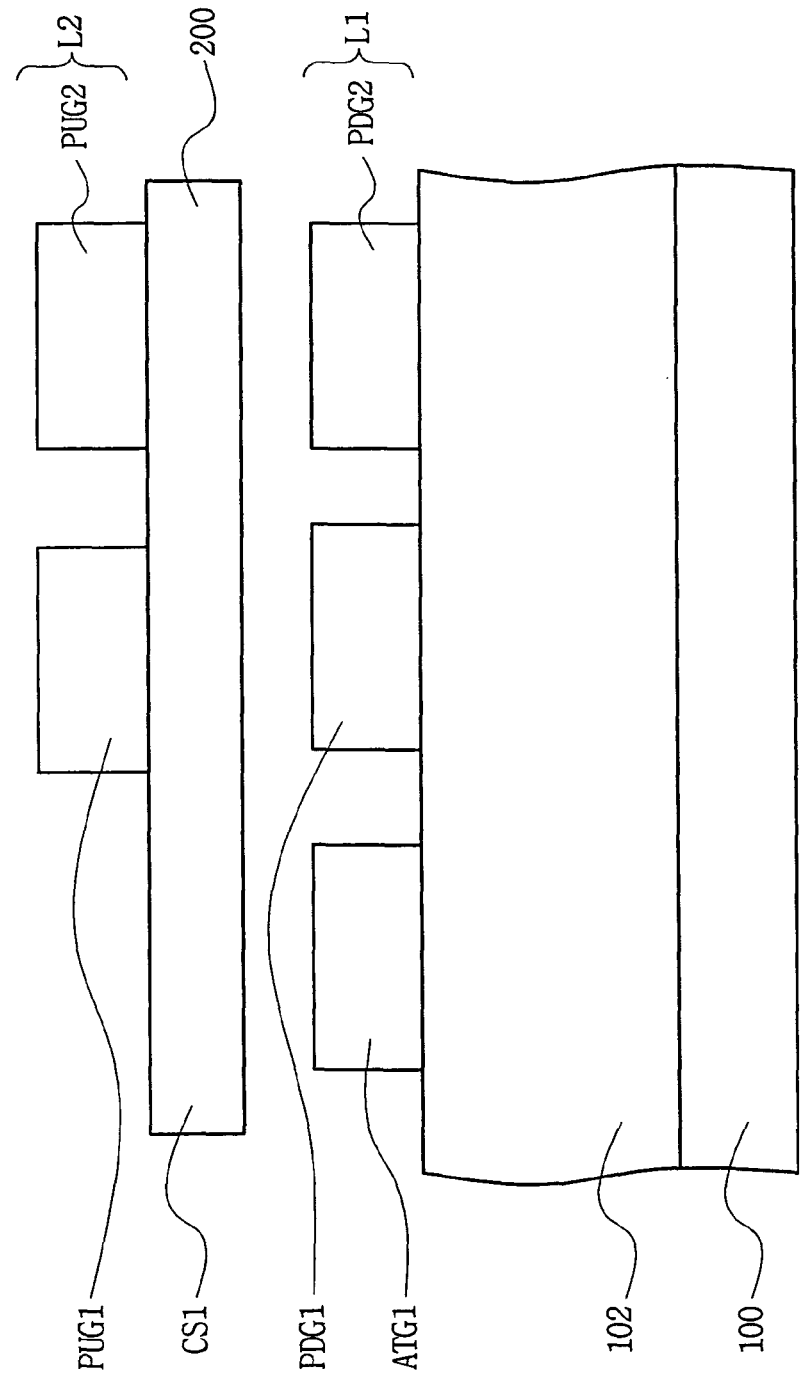
FIG. 10 is schematic cross-sectional view of a stacked-type 5T CMOS SRAM cell of FIG. 9.

FIG. 10 is a schematic cross-sectional view of the stacked-type 5T CMOS SRAM cell of FIG. 9. As shown in FIG. 10, the first pull-down transistor PD1, second pull-down transistor PD2, and pass transistor AT1 have respective gates PDG1, PDG2 and AT1 formed in layer L1. The first and second pull-up transistors PU1 and PU2 have respective gates PUG1 and PUG2 formed in a second layer L2 located over the first layer L1. Again, the first and second pull-up transistors PU1 and PU2 are respectively connected to the first and second pull-down transistors PD1 and PD2 to form an inverter latch.

Note that the pass transistor AT1 is connected between a first data node of the inverter latch and the bit line BL.

Also note that for the embodiment of FIG. 10, the first layer L1 abuts an active layer 102 and the second layer L2 abuts a first channel silicon layer 200.

As illustrated in FIGS. 9 and 10, for embodiments having a two-layer stacked single port SRAM cell, the pull-down and pass transistors can be realized in the lower layer in the form of MOS transistors. Thus, a cell ratio caused by the increase of a size of the pass transistor increases, and the improvement of overall performance is expected by ensuring a design rule margin. Further, because the pull-up transistors are disposed in the second layer, the cell is downsized over that of a conventional plane arrangement cell. Due to the single bit line, the cell can share the bit line with its neighboring memory cell.

Here, problems with the writing operation which a conventional single port SRAM cell can be solved by a word line boosting technique, diode insertion and the like. For example, it is known in the art to address the problems associated with writing operations by the diode insertion as can be found U.S. Pat. No. 6,570,227 granted to Leonard R. Rockett on May 27, 2003. In this document, a PN diode is connected between a first data node and gates of transistors of a second inverter. By reverse biasing the PN diode during a write 1 operation, the problems associated with writing data 1 are solved.

Figure 11:
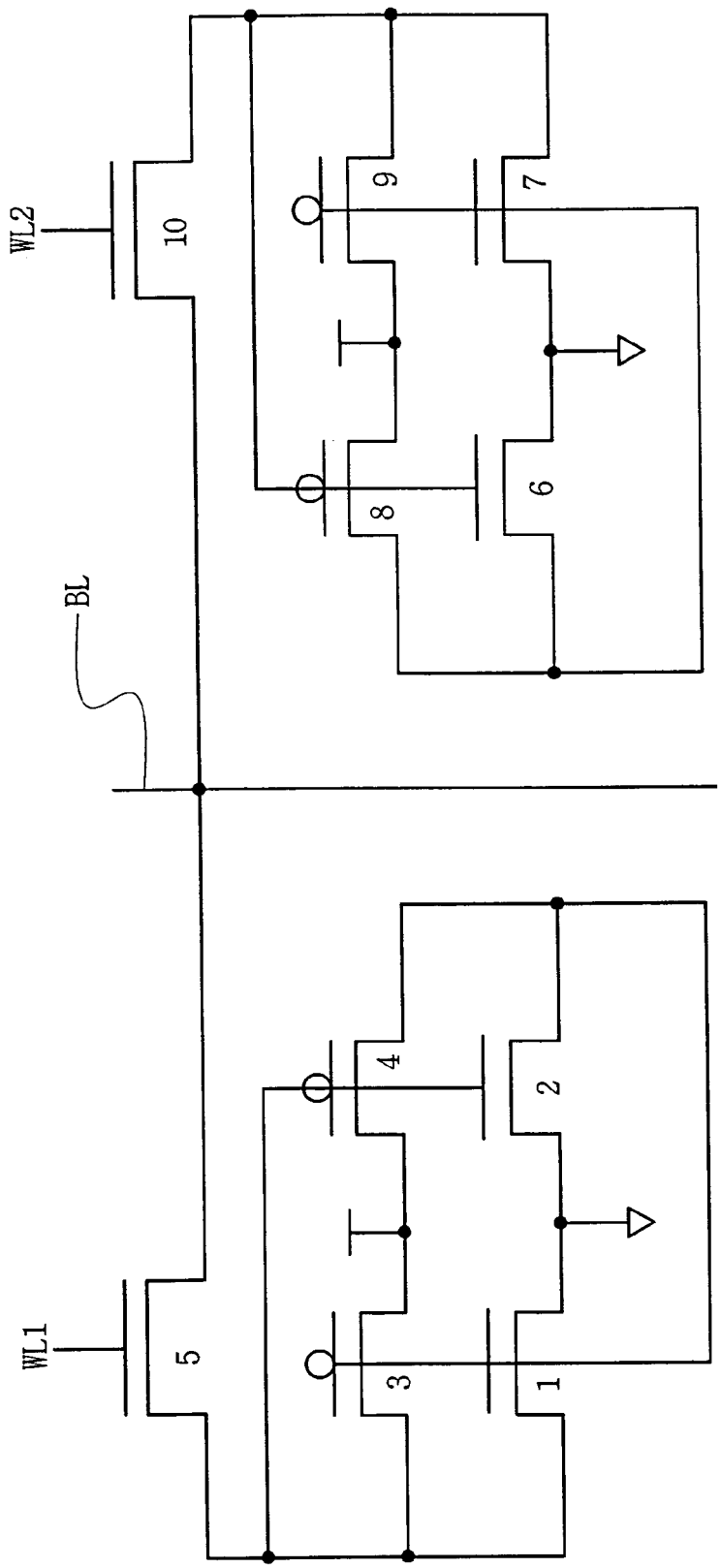
FIG. 11 is an equivalent circuit diagram of a memory cell array using a stacked-type 5T CMOS SRAM cell of FIG. 7.
Figure 12:
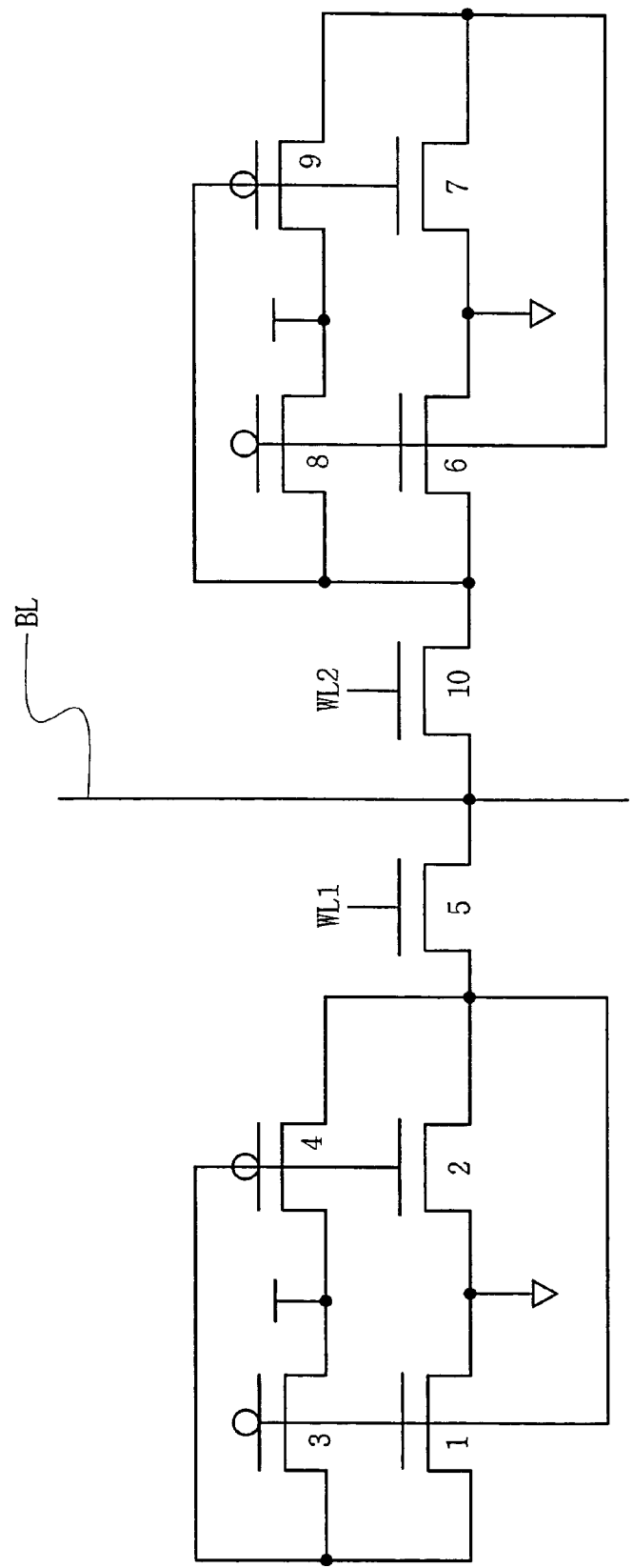
FIG. 12 is an equivalent circuit diagram of a memory cell array using a stacked-type 5T CMOS SRAM cell of FIG. 9.

FIG. 11 is an equivalent circuit diagram of a memory cell array using the stacked-type 5T CMOS SRAM cell of FIG. 7, and FIG. 12 is an equivalent circuit diagram constructing a memory cell array using a stacked-type 5T CMOS SRAM cell of FIG. 9.

Referring first to FIG. 11, it should be noted that the memory cells located on left and right sides share a single bit line BL what functions identically to the BL of FIG. 7. Note that the devices numbered 1 and 2 are pull-down transistors corresponds to the pull-down transistors PD1 and PD2 of FIG. 7, the devices numbered 3 and 4 are pull-up transistors corresponding to the pull-up transistors PU1 and PU2 of FIG. 7, and the device numbered 5 is a pass transistor AT1.

Figure 6:
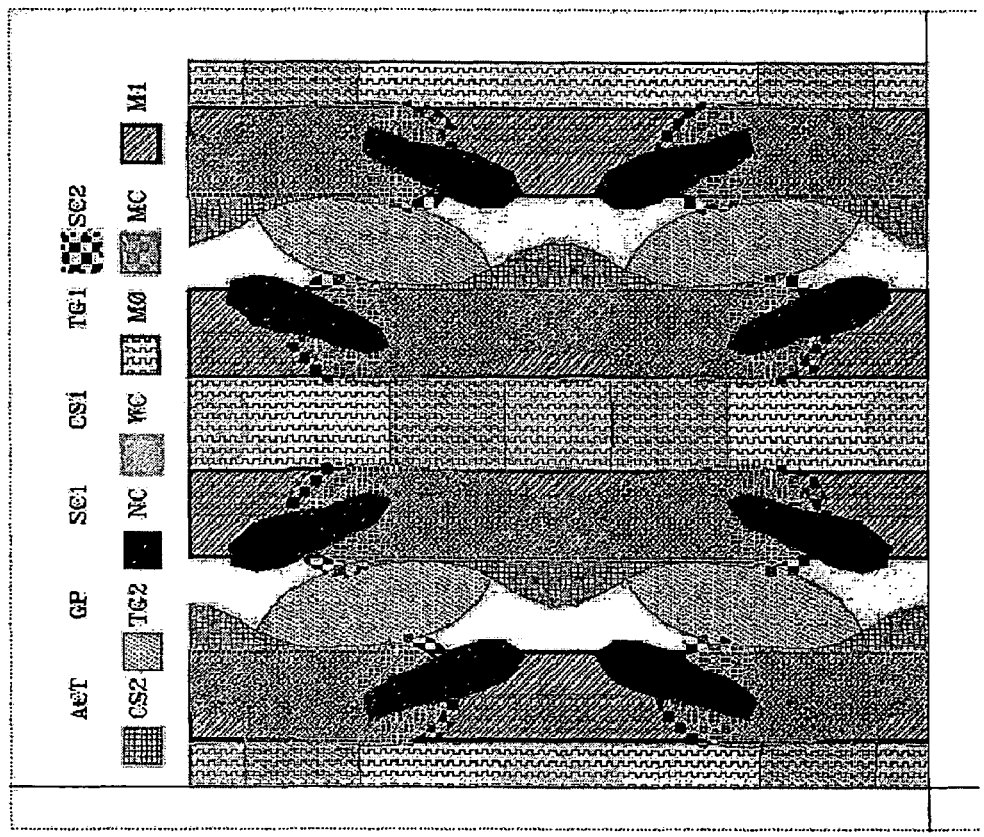

Referring to FIG. 12, memory cells located on left and right sides sharing the bit line BL of the same structure as that illustrated in FIG. 9. Hence, the device numbered 10 is a pass transistor corresponding to pass transistor AT1 of FIGS. 9, and 6 and 7 are pull-down transistors corresponding to the pull-down transistors PD1 and PD2 of FIG. 9. Similarly, the devices numbered 8 and 9 are pull-up transistors corresponding to the pull-up transistors PU1 and PU2 of FIG. 9.

Using stacked-type memory cells consistent with those of FIGS. 11 and 12, cell size is reduced to ⅓ that of the conventional six-transistor memory cell, thus enabling very high density memory systems. In other words, by disposing the transistors of a memory into several layers, the average memory cell size is reduced two to three times.

Figure 13:
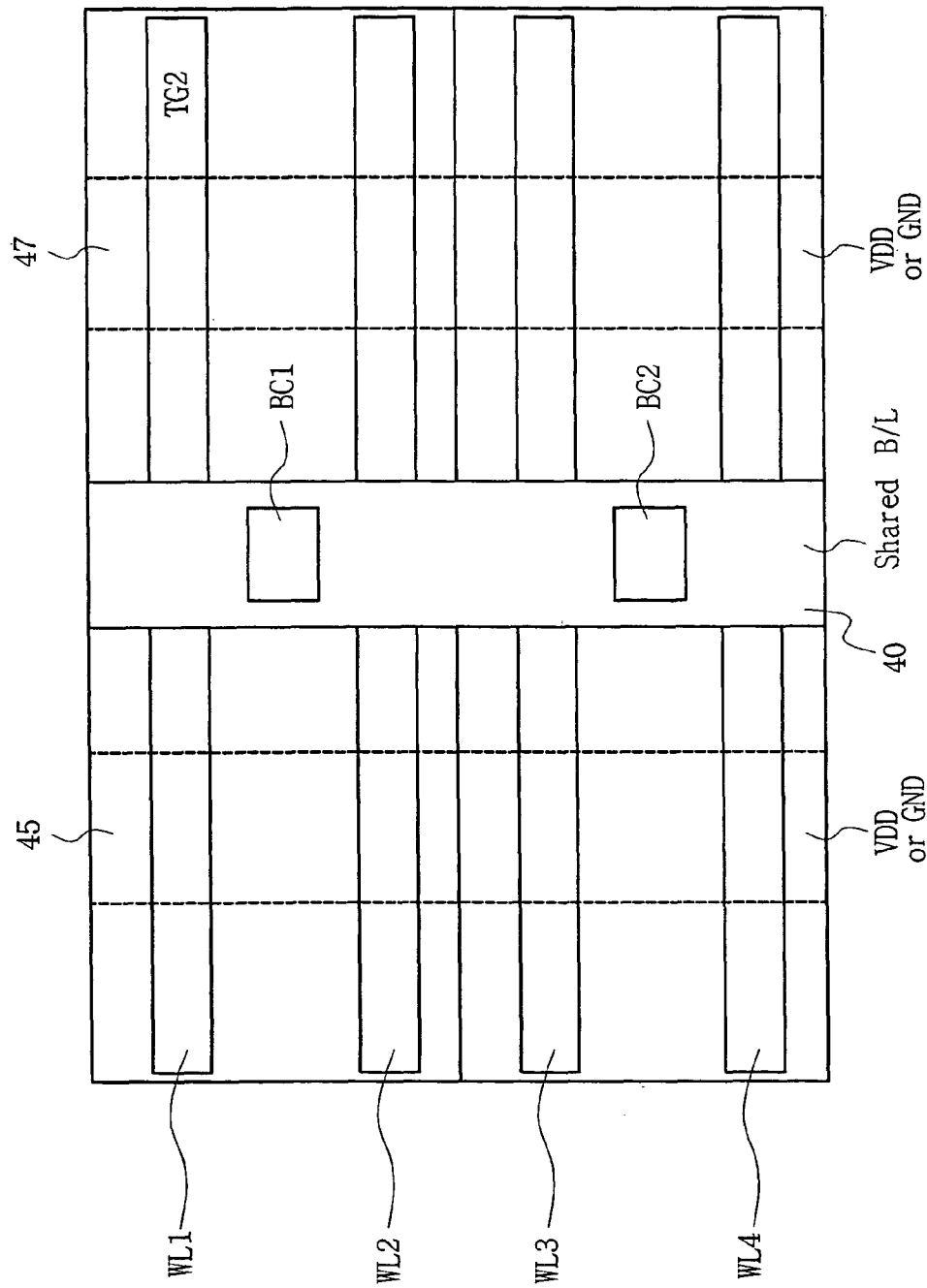
FIGS. 13 and 14 illustrate arrangements of word lines and bit lines related to a cell array configuration of stacked-type 5T CMOS SRAM cells in accordance with the present invention.
Figure 14:
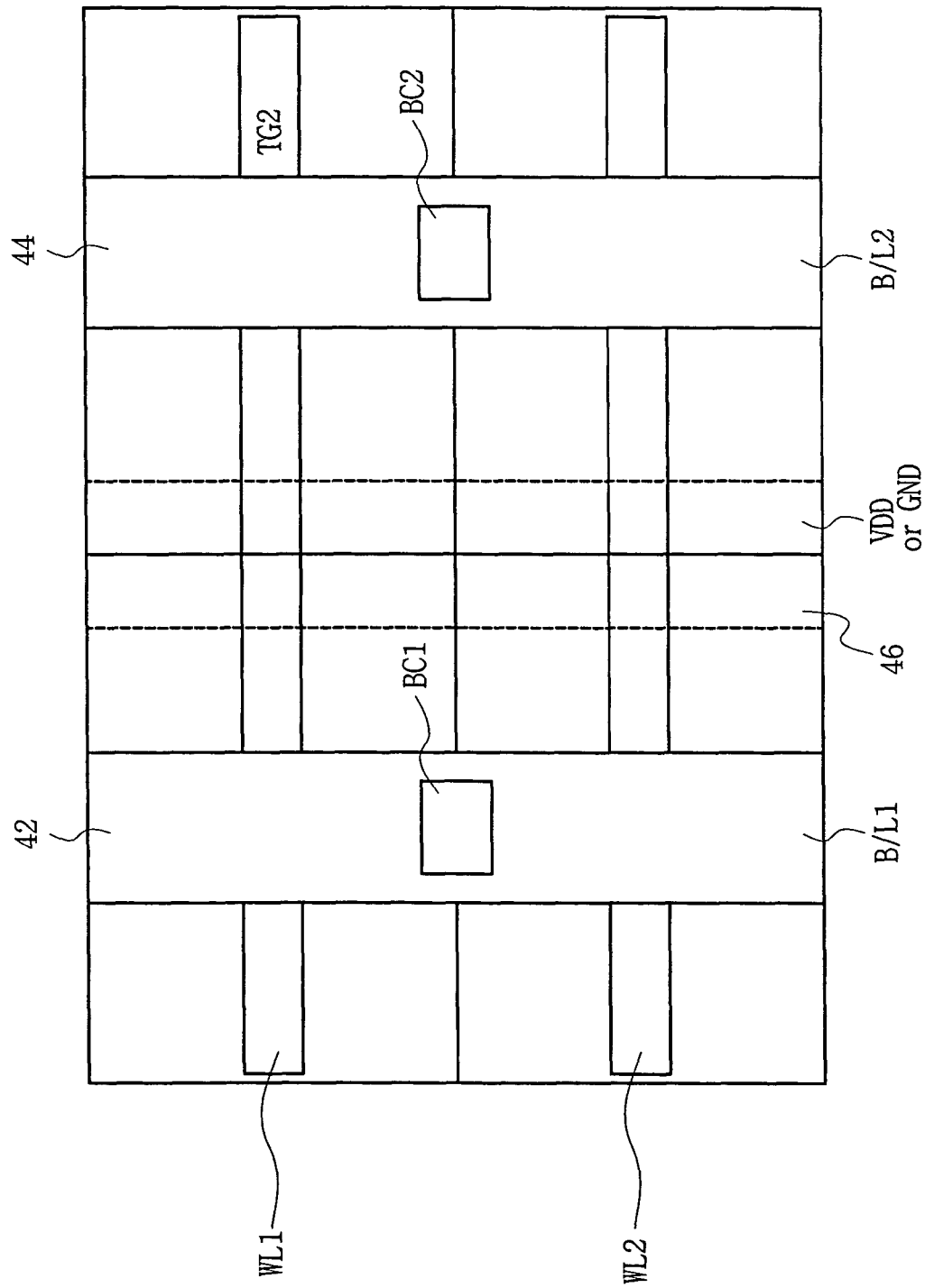

FIGS. 13 and 14 illustrate arrangement examples of word lines and bit lines related to a cell array configuration of stacked-type 5T CMOS SRAM cells in accordance with the present invention.

Referring first to FIG. 13, a structure in which power lines 45 and 47 are disposed in the same layer in parallel to a shared bit line 40 is illustrated. Here, it can be seen that word lines WL1 through WL4 are disposed below and perpendicular to the shared bit line 40. The power lines 45 and 47 can be supply voltage lines and/or ground lines. The shared bit line 40 can be connected with the drains of pass transistors of the memory cells through bit line contacts BC1 and BC2.

Referring next to FIG. 14, a structure in which a power line 47 is disposed in the same layer and in parallel to shared bit lines 42 and 44 is illustrated. Here, it can be seen that word lines WL1 and WL2 are disposed below and perpendicular to the shared bit lines 42 and 44. As with FIG. 13, the power line 46 disposed between the shared bit lines 42 and 44 can be a supply voltage lines and/or ground lines. The shared bit lines 42 and 44 are each connected with drains of pass transistors within the memory cell array through bit line contacts BC1 and BC2.

According to the construction of the above-mentioned stacked memory cell of the present invention, due to one pass transistor in the stacked-type structure, cell size can be further reduced compared to the conventional six-transistor cell, and the driving performance of the pass transistor can be improved. Thus, when a memory cell array is constructed by stacked-type five-transistor memory cells, a cell array structure in which a bit line is shared with a neighboring memory cell is also obtained, so that the high-density integration of a semiconductor memory chip can be realized.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A stacked single memory cell for use in a high-density static random access memory, the stacked memory cell comprising:
    a first pull-down transistor and a second pull-down transistor both formed in an active layer located at a surface of a semiconductor substrate, the first and second pull-down transistors including respective first and second gates located on the active layer;
    a first pull-up transistor and a second pull-up transistor both formed in a first channel layer located over and parallel to the active layer relative to the surface of the semiconductor substrate, the first and second pull-up transistors including respective third and fourth gates located on the first channel layer, wherein the first and second pull-up transistors are respectively connected to the first and second pull-down transistors to form an inverter latch; and
    a pass transistor connected between a gate of the second pull-down transistor and a bit line, and formed in a second channel layer located over and parallel to the first channel layer such the first channel layer is interposed between the active layer and the second channel layer, wherein the pass transistor includes a fifth gate located on the second channel layer and connected to a word line,
    wherein the pass transistor is a single pass transistor and the bit line is a single bit line.

2. The stacked memory cell according to claim 1, wherein at least one of the first and second channel layers is a silicon layer formed by selective epitaxial growth (SEG).

3. The stacked memory cell according to claim 1, wherein the first and second pull-down transistors are respective NMOS transistors.

4. The stacked memory cell according to claim 3, wherein the first and second pull-up transistors are respective PMOS transistors.

5. The stacked memory cell according to claim 4, wherein the pass transistor is an NMOS transistor.

* * * * *